(12) United States Patent
Baumann et al.

(10) Patent No.: US 7,169,534 B2
(45) Date of Patent: Jan. 30, 2007

(54) PHOTOPOLYMER COMPOSITION SUITABLE FOR LITHOGRAPHIC PRINTING PLATES

(75) Inventors: Harald Baumann, Osterode am Harz (DE); Michael Flugel, Osterode am Harz (DE); Udo Dwars, Herzberg am Harz (DE); Hans-Horst Glatt, Munich (DE)

(73) Assignee: Kodak Polychrome Graphics GmbH, Osterode/Harz (DE)

( * ) Notice: Subject to any disclaimer, the term of this patent is extended or adjusted under 35 U.S.C. 154(b) by 55 days.

(21) Appl. No.: 10/536,510

(22) PCT Filed: Nov. 28, 2003

(86) PCT No.: PCT/EP03/13432

§ 371 (c)(1),
(2), (4) Date: May 25, 2005

(87) PCT Pub. No.: WO2004/049069

PCT Pub. Date: Jun. 10, 2004

(65) Prior Publication Data

US 2006/0078819 A1    Apr. 13, 2006

(30) Foreign Application Priority Data

Nov. 28, 2002  (DE) ................................ 102 55 664

(51) Int. Cl.
*G03F 7/027*    (2006.01)

(52) U.S. Cl. ................ 430/276.1; 430/284.1; 430/278.1; 430/273.1; 430/302

(58) Field of Classification Search ............. 430/284.1, 430/302
See application file for complete search history.

(56) References Cited

U.S. PATENT DOCUMENTS

| | | | |
|---|---|---|---|
| 4,019,972 A * | 4/1977 | Faust ...................... 430/283.1 |
| 5,051,295 A * | 9/1991 | Mori et al. .............. 428/195.1 |
| 6,045,975 A * | 4/2000 | Tani et al. ................ 430/285.1 |
| 6,617,413 B1 * | 9/2003 | Bruchmann et al. .......... 528/75 |
| 2003/0113667 A1 * | 6/2003 | Matsumura ................. 430/302 |
| 2003/0171449 A1 * | 9/2003 | Nienhaus et al. ........... 522/173 |
| 2004/0091816 A1 * | 5/2004 | Matsumura et al. ...... 430/281.1 |

FOREIGN PATENT DOCUMENTS

| | | |
|---|---|---|
| EP | 0 557 943 A2 * | 9/1993 |
| EP | 0 453 237 A2 * | 11/2000 |
| WO | WO 00/68739 A1 * | 11/2000 |
| WO | WO 02/31015 A1 * | 4/2002 |

OTHER PUBLICATIONS

Huang et al, "Curing and Cimbustion Properites of a PU-Coating System with UV-Reactive Phosphazene", Journal of Applied Polymer Science, vol. 85, 2002, pp. 1980-1991.*

* cited by examiner

*Primary Examiner*—Cynthia Hamilton
(74) *Attorney, Agent, or Firm*—J. Lanny Tucker

(57) ABSTRACT

Radiation-sensitive elements are described whose radiation-sensitive coating comprises both a photopolymerizable oligomer with a biuret structural unit and a photopolymerizable phosphazene oligomer.

10 Claims, No Drawings

PHOTOPOLYMER COMPOSITION SUITABLE FOR LITHOGRAPHIC PRINTING PLATES

The present invention relates to radiation-sensitive elements, in particular radiation-sensitive elements whose coating comprises an oligomer with a biuret structural unit and a phosphazene oligomer. The invention furthermore relates to a process for the production of such elements, a radiation-sensitive composition suitable for the production of such elements, and a process for the production of an imaged element from such radiation-sensitive elements.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, or is oleophilic, and the non-image area (background) accepts water, or is hydrophilic. The differentiation between image and non-image areas takes place during exposure, for which a film is attached to the printing plate precursor under vacuum in order to guarantee good contact. The plate is then exposed by means of a radiation source. When a positive plate is used, the area on the film corresponding to the image on the plate is so opaque that the light does not affect the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Photosensitive mixtures have been used for years in photopolymerizable compositions for the production of photosensitive materials such as e.g. soldering masks for printed circuits and printing plates. However, an improved sensitivity in particular in the visible spectral range is required for new and advanced applications (e.g. exposure by means of lasers) so that the exposure time can be shortened. From an economic point of view it is also important that low-intensity lasers can be used, which are less expensive and more reliable than high-intensity lasers. Therefore, efforts have been made for some time to increase the sensitivity of photosensitive mixtures to be used in photopolymerizable compositions.

It is known that the free-radical polymerization of ethylenically unsaturated compounds can be initiated by irradiation with visible light in the presence of photoreducible dyes and reducing agents, e.g. amines (U.S. Pat. No. 3,097,096). EP-A-122 223 discloses photoinitiators and photopolymerizable compositions comprising metallocenes. The use of such metallocenes resulted in an increase in the sensitivity of the photopolymerizable layer and thus a reduction of the necessary irradiation time and the required power of the radiation source. Attempts were also made to obtain improved results from the use of metallocenes that had been modified further, e.g. in the documents EP-A-401 165, U.S. Pat. No. 4,590,287, EP-A-255 486, EP-A-256 981 and U.S. Pat. No. 5,106,722.

Document DE-A-40 08 815 describes a photopolymerizable mixture comprising a polymeric binder, a free-radical polymerizable compound with at least one polymerizable group and at least one photooxidizable group in the molecule and a metallocene compound as photoinitiator.

In order to further improve sensitivity, it was tried to use the metallocene compound together with a coinitiator. For example, EP-B-269 573 discloses liquid mixtures of photoinitiators which are solutions of titanocene compounds in liquid photoinitiators of the type α-hydroxy- and α-aminoacetophenone derivatives. DE-A-38 32 032 describes a photopolymerizable mixture comprising a polymeric binder, a free-radical polymerizable compound with at least one polymerizable group, a photoreducible dye, and, as initiator, a metallocene compound as well as a coinitiator. The coinitiator is a trihalogenomethyl compound divisible by radiation, which is intended to increase photosensitivity. Compounds with a triazine ring in the parent substance carrying two trihalogenomethyl groups are preferred.

DE-A-40 13 358 describes a specific process for the production of printing forms or photoresists using metallocene compounds as photoinitiator, which is aimed at an improvement of sensitivity.

U.S. Pat. No. 3,717,558 describes metallocenes of subgroup elements in combination with a further photoinitiator comprising an activated halogen-containing group for the use in photopolymerizable recording materials. However, these initiator combinations are very sensitive to oxygen and hydrolysis and are therefore not very suitable for the production of printing plates and resist materials.

The use of a combination of specific organometal compounds and onium salts in a hardening agent for polymerizable compositions is also known (U.S. Pat. No. 5,086,086). As metallocene compound, organometal compounds are used whose essential feature is that they comprise at least one metal-metal sigma bond, i.e. that at least two transition-metal atoms are present in one complex. The hardening agents described in U.S. Pat. No. 5,086,086 are not used together with dyes for light-induced polymerization.

U.S. Pat. No. 4,971,892 discloses photopolymerizable compositions which are particularly suitable for printing plates and are said to exhibit a high degree of sensitivity to visible light. As initiator system for free-radical polymerization, these photopolymerizable compositions comprise an initiator selected from diaryliodonium salts, halogenated triazines and triarylsulfonium salts, as well as a specific merocyanine dye.

U.S. Pat. No. 4,959,297 is directed to photopolymerizable compositions comprising at least one vinyl monomer capable of undergoing free-radical polymerization, a photoinitiator system, a diaryliodonium salt, a pigment, one or more electron donating compounds and additives. Finally, DE-A-4,217,495 discloses a photopolymerizable mixture and a recording material produced therefrom.

DE-A-4,418,645 describes a photosensitive mixture comprising a binder, one or more polymerizable compounds with at least one polymerizable group and one or more dyes absorbing in the range of 250 nm to 700 nm, as well as an initiator system comprising at least one metallocene compound and at least one onium compound.

EP-A-453237 describes film-forming photosensitive resin compositions for printed circuit boards, semiconductor components and the like. The composition comprises a non-photosensitive polyimide precursor, a polymerization initiator and a polymerizable monomer/oligomer that provides a highly temperature-resistant polymer by means of polymerization. The polymerizable monomer can for example be a mixture of a (meth)acrylic acid monomer/oligomer and a phosphazene monomer/oligomer. It is stated that the obtained films are characterized by good heat-resistance, moisture-resistance, insulating properties, weathering resistance, strength and low production costs. The photosensitivity of the compositions is not discussed.

EP-A-557943 relates to hardenable resin compositions comprising a hardenable phosphazene compound. The surface hardness, transparency and weathering resistance of films produced therefrom is especially pointed out; according to this document, the possible fields of application of these films include e.g. car paints, construction materials and flooring materials. Properties like photosensitivity and dissolution of the hardenable resin compositions are not discussed.

In addition to good adhesion of the radiation-sensitive composition to the substrate, soldering masks for printed circuits most importantly require a specific surface hardness of the coating. Document WO 00/68739 describes that by using selected polymerizable phosphazene compounds a satisfactory surface hardness and adhesion to the substrate can be obtained. The storage stability and radiation-sensitivity of such radiation-sensitive compositions are not discussed.

DE-A-2,361,041 describes a photopolymerizable copying mass which exhibits sufficient adhesion without being tacky even on metal substrates that have not been especially refined. The copying masses only show a low cold flow and are especially suitable to be used in form of so-called dry resist materials. The copying masses are characterized in that they comprise an acid amide group-containing polymerizable acrylic acid or alkylacrylic acid derivative that is non-volatile at 100° C. and comprises at least two polymerizable groups in the molecule. Storage stability and radiation-sensitivity are not discussed in this document, either.

Despite the progress that has already been made in improving the adhesion to the substrate and in increasing the sensitivity of photopolymerizable mixtures, there is still a need for mixtures with properties that have been improved even further, in particular excellent radiation sensitivity in combination with good storage stability.

It is the object of the present invention to provide novel radiation-sensitive elements exhibiting improved properties compared to the ones known in the prior art, in particular high photosensitivity, a high degree of thermal stability, high resolution in combination with good storage stability, and—in the case of printing plates—yielding a large number of copies on the printing machine.

This problem is solved by the provision of a radiation-sensitive element comprising (a) an optionally pretreated substrate and
(b) a radiation-sensitive coating comprising
　(i) at least one absorber selected from photoinitiators and sensitizers, which is capable of absorbing radiation of a wavelength in the range of 250 to 1,200 nm;
　(ii) at least one oligomer A of formula (I)

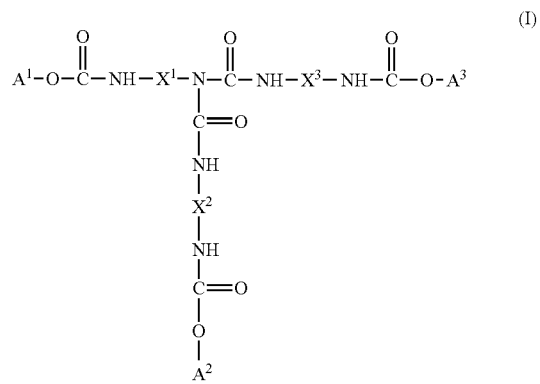

wherein $X^1$, $X^2$ and $X^3$ are independently selected from $C_2$–$C_{18}$ alkanediyl and $C_6$–$C_{20}$ arylene, $A^1$, $A^2$ and $A^3$ are independently selected from —(CHR'—CHR'—O)$_k$–CH$_2$—CH=CH$_2$　and

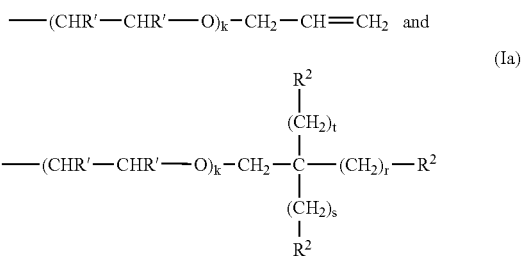

wherein R' is independently selected from a hydrogen atom and CH$_3$ and k=0 or an integer from 1 to 10, each $R^2$ is independently selected from a hydrogen atom, a group

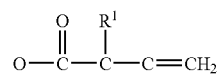

and a group —O—CH$_2$—CH=CH$_2$, $R^1$ is a hydrogen atom or $C_1$–$C_{12}$ alkyl and r, s and t independently of each other are 0 or 1 with the proviso that in each group $A^1$, $A^2$ and $A^3$ at least one $R^2$ is not a hydrogen atom if $A^1$, $A^2$ and $A^3$ all represent a group of the formula (Ia), and (iii) at least one oligomer B, which is a phosphazene of formula (II) or (IIa):

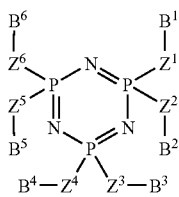
(IIa)

wherein $Z^1$, $Z^2$, $Z^3$, $Z^4$, $Z^5$ and $Z^6$ are independently selected from —O— and —NR—, R is a hydrogen atom or $C_1$–$C_{12}$ alkyl, n is greater than 3 and $B^1$, $B^2$, $B^3$, $B^4$, $B^5$ and $B^6$ are independently selected from

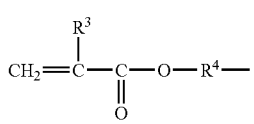
(III)

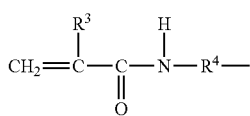
(IV)

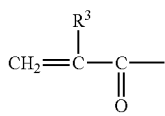
(V)

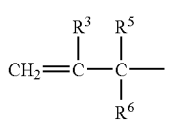
(VI)

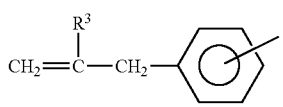
(VII)

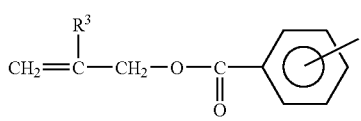
(VIII)

wherein $R^3$ is a hydrogen atom or $C_1$–$C_{12}$ alkyl, $R^4$ is $C_2$–$C_{12}$ alkanediyl and $R^5$ and $R^6$ are each independently selected from a hydrogen atom and $C_1$–$C_{12}$ alkyl.

Unless indicated otherwise, the terms "alkyl group and alkanediyl group" as used in the present invention refer to a straight-chain, branched or cyclic alkyl group or alkanediyl group. These groups can optionally comprise one or more substituents selected from halogen atoms (fluorine, chlorine, bromine, iodine), $C_1$–$C_{12}$ alkoxy,

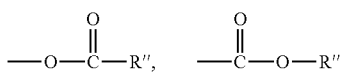

and —O—R" (wherein R" is $C_1$–$C_{18}$ alkyl).

Unless indicated otherwise, the terms "aryl group or arylene group" as used in the present invention refer to an aromatic carbocyclic mono- or divalent group with one ring or several fused rings optionally comprising one or more substituents selected from halogen atoms (fluorine, chlorine, bromine, iodine), $C_1$–$C_{12}$ alkoxy,

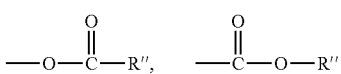

and —O—R" (wherein R" is $C_1$–$C_{18}$ alkyl),

The shortened terms "(meth)acrylate" and "(meth)acrylic acid" indicate that both methacrylate and acrylate and acrylic acid and methyacrylic acid, respectively, are meant.

For obtaining high sensitivity in combination with good developability and storage stability it is essential that the radiation-sensitive composition comprises at least one oligomer of the biuret type according to formula (I) and at least one phosphazene oligomer according to formula (II) or (IIa).

In the oligomer of formula (I), the groups $X^1$, $X^2$ and $X^3$ are independently selected from $C_2$–$C_{18}$ alkanediyl (preferably $C_2$–$C_8$ alkanediyl, especially preferred hexamethylene) and $C_6$–$C_{20}$ arylene (preferably phenylene or naphthylene). It is preferred that $X^1$=$X^2$=$X^3$.

In one embodiment, oligomer A is obtained by reacting at least one acrylate or methacrylate comprising (a) hydroxy group(s) with the biuret of hexamethylene diisocyanate.

The groups $A^1$, $A^2$ and $A^3$ are independently selected from

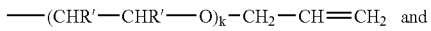

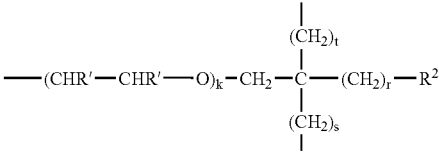
(Ia)

If all groups $A^1$, $A^2$ and $A^3$ represent a group of formula (Ia), it is important that in each group $A^1$, $A^2$ and $A^3$ at least one group $R^2$ is not a hydrogen atom so that a C—C double bond is present.

$R^1$ is a hydrogen atom or $C_1$–$C_{12}$ alkyl, preferably a hydrogen atom or $C_1$–$C_4$ alkyl, especially preferred a hydrogen atom or a methyl group.

R' is independently selected from a hydrogen atom and $CH_3$; preferably both R' are hydrogen, or one R' is hydrogen and the other $CH_3$. k is an integer from 0 to 10, preferably 0.

If $R^2$ is not a hydrogen atom, $R^2$ is preferably methacrylate or acrylate.

r, s and t independently of each other are 0 or 1; it is preferred that r=s=t, especially preferred that r=s=t=1.

In a preferred embodiment, $A^1$, $A^2$ and $A^3$ are independently derived from hydroxyethyl(meth)acrylate or pentaerythritol, which has been esterified with (meth)acrylic acid three times.

The oligomer A of formula (I) can be prepared as follows:

In a first step, the biuret parent structure is prepared by reacting at least one diisocyanate of the formula

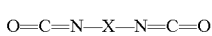

(wherein X is defined as $X^1$, $X^2$ and $X^3$) with an appropriately selected amount of water, usually 3 moles diisocyanate(s) and 1 mole water (cf. e.g. DE-B-1,101,394 and Houben-Weyl, *Methoden der organischen Chemie* [methods in organic chemistry], 4th edition (1963), Vol. 14/2, pages 69 et seqq.). The reaction is preferably carried out without a solvent.

In a second step, the terminal isocyanate groups are reacted with at least one unsaturated compound comprising one or more hydroxy groups selected from $$HO-(CHR'-CHR'-O)_k-CH_2-CH=CH_2 \text{ and}$$

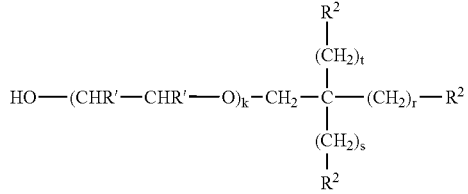

wherein $R^2$, $R'$, k, r, s and t are as defined above.

If the biuret is reacted with several unsaturated compounds comprising OH groups, the reaction can be carried out in stages (i.e. the unsaturated compounds are reacted with the biuret one after the other) or simultaneously (i.e. the unsaturated compounds are all reacted with the biuret at the same time).

The reaction is usually carried out in aprotic solvents such as e.g. benzene, toluene, xylene, a ketone (e.g. methylethylketone) or an ester (e.g. butyl acetate) in the presence of a catalyst (e.g. tertiary amines or tin organyls such as dibutyltin dilaurate and dioctyltin dilaurate) and an inhibitor for preventing thermal polymerization at a temperature between room temperature and about 80° C.

Subsequently, a low alcohol (e.g. methanol or ethanol) can be added if needed to react with unreacted isocyanate.

By appropriately selecting the molar ratio of the unsaturated compounds, the ratio of the different groups $A^1$, $A^2$ and $A^3$ can be controlled. Details regarding the preparation of the oligomers A can be inferred from e.g. DE-A-2,361,041.

The radiation-sensitive coating can comprise one or more kinds of oligomers A.

The radiation-sensitive coating of the elements according to the present invention furthermore comprises at least one phosphazene oligomer B of formula (II) or (IIa).

$Z^1$, $Z^2$, $Z^3$, $Z^4$, $Z^5$ and $Z^6$ are independently selected from —O— and —NR—, wherein —O— is preferred. R is selected from a hydrogen atom and $C_1$–$C_{12}$ (preferably $C_1$–$C_6$) alkyl and is preferably a hydrogen atom.

The groups $B^1$, $B^2$, $B^3$, $B^4$, $B^5$ and $B^6$ are independently selected from the above formulas (III) to (VIII). In the case of a linear phosphazene of formula (II), it is preferred that $B^1=B^2$ and in the case of the cyclic phosphazene of formula (IIa), it is preferred that $B^1=B^2=B^3=B^4=B^5=B^6$.

$R^3$ is selected from a hydrogen atom and $C_1$–$C_{12}$ (preferably $C_1$–$C_6$) alkyl; in a preferred embodiment, $R^3$ is either a hydrogen atom or a methyl group.

$R^4$ is $C_2$–$C_{12}$ (preferably $C_1$–$C_6$) alkanediyl.

$R^5$ and $R^6$ are independently selected from a hydrogen atom and $C_1$–$C_{12}$ (preferably $C_1$–$C_6$) alkyl. It is especially preferred that both $R^5$ and $R^6$ are hydrogen atoms.

In the groups according to formulas (VII) and (VIII) it is preferred that the binding site at the phenyl ring is in para-position with respect to the shown unsaturated substituent.

In a preferred embodiment, the groups $B^1$ and $B^2$ and $B^1$ to $B^6$ are identical and are represented by formula (III).

Cyclic phosphazenes of formula (IIa) are preferred, and especially preferred are phosphazenes of formula (IIa), wherein:

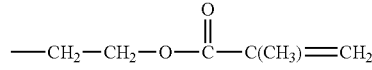

$$-CH_2-CH_2-O-\overset{O}{\underset{\|}{C}}-C(CH_3)=CH_2$$

Phosphazene oligomers that can be used in the present invention are for example described in EP-A-376021 and WO 00/68739. Details regarding their synthesis can be inferred from these documents. The essential synthesis conditions can be summarized as follows:

The phosphazenes of formulas II and IIa are prepared from the corresponding chlorophosphazenes by reacting them with a compound B—OH (if Z is —O—) or a compound B—NRH (if Z is —NR—) in the presence of a basic catalyst (e.g. with pyridine). The reaction is usually carried out in an aprotic solvent such as e.g. benzene, toluene, xylene, THF, 1,4-dioxane or cyclohexane.

The amounts of oligomer A and B in the radiation-sensitive layer are not particularly restricted, however, oligomer A is preferably present in an amount of 5 to 85 wt.-% (especially preferred 10 to 70 wt.-%), based on the dry layer weight, and oligomer B is preferably present in an amount of 5 to 60 wt.-% (especially preferred 10 to 40 wt.-%), based on the dry layer weight.

The ratio of oligomer A to oligomer B is not particularly restricted, however, it is preferably 1:0.1 to 1:10, especially preferred 1:0.2 to 1:5.

The radiation-sensitive coating additionally also comprises at least one absorber selected from photoinitiators and sensitizers.

The absorber is selected such that it is capable of considerable absorption in the range of the spectrum in which the radiation source used later on during imaging emits, and preferably shows an absorption maximum in this range. For instance, if it is planned to image the radiation-sensitive element by means of an IR-laser, the absorber should significantly absorb radiation in the range of about 750 to 1,200 nm and preferably show an absorption maximum in that range. If, on the other hand, imaging by means of UV radiation is desired, the absorber should significantly absorb in the range of about 250 to 400 nm and preferably show an absorption maximum in that range. Suitable photoinitiators or sensitizers are known to the person skilled in the art, or he can easily determine by means of simple tests (e.g. recording an absorption spectrum) whether significant absorption takes place in the desired wavelength range.

In the present invention, a photoinitiator is a compound capable of absorbing radiation when exposed and of forming free radicals by itself, i.e. without the addition of coinitiators. Examples of suitable photoinitiators include triazine derivatives with 1 to 3 $CX_3$ groups (wherein every X is independently selected from a chlorine or bromine atom, and is preferably a chlorine atom), hexaarylbisimidazole compounds, benzoin ethers, benzyl ketals, oxime ethers, oxime esters, α-hydroxy- or α-amino-acetophenones, acylphosphines, acylphosphine oxides, acylphosphine sulfides, metallocenes, peroxides etc. Examples of suitable triazine derivatives include 2-phenyl-4,6-bis(trichloromethyl)-s-triazine, 2,4,6-tris (trichloromethyl)-s-triazine, 2-methyl-4,6-bis(trichloromethyl)-s-triazine, 2-(styryl-4,6-bis (trichloromethyl)-s-triazine, 2-(p-methoxystyryl)-4,6-bis (trichloromethyl)-s-triazine, 2-(4-methoxy-naphtho-1-yl)-4,6-bis-trichloromethyl-s-triazine, and 2-(4-ethoxy-naphtho-1-yl)-4,6-bis (trichoromethyl)-s-triazine and 2-[4-(2-ethoxyethyl)-naphtho-1-yl]-4,6-bis(trichloromethyl) -s-triazine. Suitable oxime ethers and oxime esters are for example those derived from benzoin. Preferred metallocenes are for example titanocenes with two five-membered cyclodienyl groups such as e.g. cyclopentadienyl groups and one or two six-membered aromatic groups having at least one ortho-fluorine atom and optionally also one pyrryl group; most preferred metallocenes are bis(cyclopentadienyl)-bis-[2,6-difluoro-3-(pyrr-1-yl)-phenyl]titanium and dicyclopentadiene-bis-2,4,6-trifluorophenyl-titanium or zirconium.

In the present invention, a single photoinitiator or a mixture of two or more can be used.

The photoinitiators can be used alone or in combination with one or more coinitiators; the addition of coinitiators can increase the effectiveness of the photoinitiation.

The amount of photoinitiator(s) is not particularly restricted; however, if photoinitiators are present, it is preferably in the range of 0.2 to 25 wt.-%, based on the dry layer weight, especially preferred 0.5 to 15 wt.-%.

A sensitizer as referred to in the present invention is a compound which can absorb radiation when it is exposed but which cannot by itself, i.e. without the addition of coinitiators, form free radicals.

All light-absorbing compounds that are photooxidizable or photoreducible or capable of transferring their excitation energy to receptor molecules are suitable sensitizers for use in the present invention. Examples of such dyes include cyanine dyes, merocyanine dyes, oxonol dyes, diarylmethane dyes, triarylmethane dyes, xanthene dyes, coumarin derivatives, ketocoumarin dyes, acridine dyes, phenazine dyes, quinoxaline dyes, pyrrylium dyes or thiapyrrylium dyes, azaanulene dyes (such as phthalocyanines and porphyrines), indigo dyes, anthraquinone dyes, polyarylenes, polyarylpolyenes, 2,5-diphenylisobenzofuranes, 2,5-diarylfuranes, 2,5-diarylthiofuranes, 2,5-diarylpyrroles, 2,5-diarylcyclopentadienes, polyarylphenylenes, polyaryl-2-pyrazolines, carbonyl compounds such as aromatic ketones or quinones, e.g. benzophenone derivatives, Michler's ketone, thioxanthone derivatives, anthraquinone derivatives and fluorenone derivatives.

In the present invention, one sensitizer or a mixture of two or more can be used.

The sensitizers are used in combination with one or more coinitiators. Additionally, photoinitiators can be used; however, this is not preferred.

The amount of sensitizer(s) is not particularly restricted; however, if sensitizers are present, it is preferably in the range of 0.2 to 15 wt.-%, based on the dry layer weight, especially preferred 0.5 to 10 wt.-%. If both photoinitiators and sensitizers are present in the coating, their total amount is preferably 0.5 to 30 wt.-%, based on the dry layer weight, especially preferred 1 to 15 wt.-%.

A coinitiator as referred to in the present invention is a compound that is essentially unable to absorb when exposed and forms free radicals together with the light-absorbing sensitizers or photoinitiators. Coinitiators suitable for use in the present invention include e.g. amines such as alkanol amines or 4-dialkylaminebenzoic acid esters, diaryliodonium salts, triarylsulfonium salts, aryldiazonium salts, N-arylglycine derivatives, diaryldiiminodiacetic acid compounds, aryloxyacetic acid, aromatic sulfonyl halides, trihalomethylsulfones, nitrogen heterocycles with N-oxide substituents (such as alkoxy pyridinium salts), nitrogen heterocycles such as N-benzoyloxyphthalimide, diazosulfonates, 9,10-dihydroanthracene derivatives, thiol compounds (e.g. mercaptobenzthiazole, mercaptobenzimidazole and mercaptotriazole), triazine derivatives with 1 to 3 $CX_3$ groups (wherein every X is independently selected from a chlorine or bromine atom, and is preferably a chlorine atom), hexaarylbisimidazole compounds, benzoin ethers, benzyl ketals, oxime ethers, oxime esters, α-hydroxy- or α-amino-acetophenones, acylphosphines, acylphosphine oxides, acylphosphine sulfides, metallocenes, peroxides etc., carbonyl compounds such as aromatic ketones or quinones, e.g. benzophenone derivatives, Michler's ketone, thioxanthone derivatives, anthraquinone derivatives and fluorenone derivatives.

Many coinitiators can also function as photoinitiators when they are exposed in their absorption band. This way, photosensitive layers can be obtained that are e.g. sensitive over a wide spectral range because a photoinitiator or sensitizer covers the long-wavelength spectral range (IR and/or visible range) and a coinitiator covers the short-wavelength spectral range (e.g. the UV range). This effect can be advantageous if the consumer wants to irradiate the same material with different radiation sources. In the sense of the definition given above, the coinitiator functions as an actual coinitiator for the IR or visible range, while it functions as a photoinitiator for the UV range.

In the present invention, one coinitiator or a mixture of coinitiators can be used.

The amount of coinitiator(s) is not particularly restricted; however, it is preferably in the range of 0.2 to 25 wt.-%, based on the dry layer weight, especially preferred 0.5 to 15 wt.-%.

In addition to the free-radical polymerizable oligomers A and B, the radiation-sensitive coating can also comprise other C—C unsaturated monomers and/or oligomers and/or polymers comprising at least one C—C double or triple bond. Such compounds are well known to the person skilled in the art and can be used in the present invention without any particular limitations. Esters of acrylic and methacrylic acids, itaconic acid, crotonic acid, isocrotonic acid, maleic acid and fumaric acid with one or more unsaturated groups in the form of monomers, oligomers or prepolymers are preferred. They may be present in solid or liquid form, with solid and highly viscous forms being preferred. Compounds suitable as monomers include for instance trimethylol propane triacrylate and methacrylate, pentaerythrite triacrylate and methacrylate, dipentaerythritemono hydroxy pentaacrylate and methacrylate, dipentaerythrite hexaacrylate and methacrylate, pentaerythrite tetraacrylate and methacrylate, ditrimethylol propane tetraacrylate and methacrylate, diethyleneglycol diacrylate and methacrylate, triethyleneglycol diacrylate and methacrylate or tetraethyleneglycol diacrylate and methacrylate. Suitable oligomers and/or prepolymers are for example urethane acrylates and methacrylates, epoxide acrylates and methacrylates, polyester acrylates and methacrylates, polyether acrylates and methacrylates or unsaturated polyester resins.

In addition to monomers and/or oligomers, use can also be made of polymers comprising free-radical polymerizable C—C double bonds in the main or side chains. Examples thereof include reaction products of maleic acid anhydride olefin copolymers and hydroxyalkyl(meth)acrylates; polyesters comprising an allylalcoholester group; reaction products of polymeric polyalcohols and isocyanato(meth)acrylates; unsaturated polyesters; (meth)acrylate-terminated polystyrenes, poly(meth)acrylic acid ester, poly(meth)acrylic acids, poly(meth)acrylamides and polyethers. In this connection, the prefix "(meth)" indicates that both derivatives of acrylic acid and of methacrylic acid can be used.

Additional suitable C—C unsaturated free-radical polymerizable compounds are described e.g. in EP-A-1 176 007.

The amount of free-radical polymerizable monomers, oligomers or polymers different from oligomers A and B is preferably 0 to 40 wt.-%, based on the dry layer weight; when monomers/oligomers are used, it is preferably 0 to 20 wt.-%.

Optionally, the radiation-sensitive coating of the present invention can also comprise a binder or a mixture of binders. The binder is preferably selected from polyvinyl acetals, acrylic polymers and polyurethanes. It is preferred that the binder contains acid groups, especially preferred carboxy groups. Most preferred are acrylic polymers. Binders with acid groups preferably have an acid number in the range of 20 to 180 mg KOH/g polymer. Optionally, the binder can comprise unsaturated groups in the main chain or the side chains. Such unsaturated bonds are capable of undergoing a free-radical photopolymerization reaction or another photoreaction such as e.g. a 2+2-photocycloaddition.

The binder is preferably present in an amount of 0 to 85 wt.-%, based on the dry layer weight, especially preferred in an amount of 0 to 60 wt.-%.

The radiation-sensitive composition of the present invention can optionally also comprise small amounts of a thermopolymerization inhibitor in order to prevent an undesired thermopolymerization of the ethylenically unsaturated monomer during the production or storage of the photosensitive composition. Suitable examples of thermopolymerization inhibitors include hydroquinone, p-methoxyphenol, 2,6-di-t-butyl-p-cresol, pyrrogallol, t-butylcatechol, benzoquinone, 4,4'-thio-bis-(3-methyl-6-t-butylphenol), 2,2'-methylene-bis-(4-methyl-6-t-butylphenol) and N-nitrosophenylhydroxylamine salts. The amount of thermopolymerization inhibitor in the photosensitive composition of the present invention is preferably 0 to 5 wt.-%, based on the dry layer weight, especially preferred 0.01 to 2 wt.-%. The thermopolymerization inhibitors are often introduced into the radiation-sensitive coating via commercial monomers or oligomers and are therefore not expressly mentioned.

Furthermore, the photosensitive layer of the present invention can comprise dyes or pigments for coloring the layer. Examples of colorants include e.g. phthalocyanine pigments, azo pigments, carbon black and titanium dioxide, ethyl violet, crystal violet, azo dyes, anthraquinone dyes and cyanine dyes. The amount of colorant is preferably 0 to 20 wt.-%, based on the dry layer weight, especially preferred 0.5 to 10 wt.-%.

For improving the physical properties of the hardened coating, the inventive radiation-sensitive coating can additionally comprise further additives such as plasticizers or inorganic fillers. Suitable plasticizers include e.g. dibutyl phthalate, dioctyl phthalate, didodecyl phthalate, dioctyl adipate, dibutyl sebacate, triacetyl glycerin und tricresyl phosphate. The amount of plasticizer is not particularly restricted, however, it is preferably 0 to 10 wt.-%, based on the dry layer weight, especially preferred 0.25 to 5 wt.-%.

The radiation-sensitive coating can also comprise known chain transfer agents such as e.g. mercapto compounds. They are preferably used in an amount of 0 to 15 wt.-%, based on the dry layer weight, especially preferred 0.5 to 5 wt.-%.

Furthermore, the radiation-sensitive coating can comprise leuco dyes such as e.g. leuco crystal violet and leucomalachite green. They are preferably present in an amount of 0 to 10 wt.-%, based on the dry layer weight, especially preferred 0.5 to 5 wt.-%.

Additionally, the radiation-sensitive coating can comprise surfactants. Suitable surfactants include siloxane-containing polymers, fluorine-containing polymers and polymers with ethylene oxide and/or propylene oxide groups. They are preferably present in an amount of 0 to 10 wt.-%, based on the dry layer weight, especially preferred 0.2 to 5 wt.-%.

Further optional components of the radiation-sensitive coating include inorganic fillers such as e.g. $Al_2O_3$ and $SiO_2$. They are preferably present in an amount of 0 to 20 wt.-%, based on the dry layer weight, especially preferred 0.1 to 5 wt.-%.

The radiation-sensitive elements of the present invention can for example be printing plate precursors (in particular precursors of lithographic printing plates), printed circuit boards for integrated circuits or photomasks.

A dimensionally stable plate or foil-shaped material is preferably used as a substrate in the production of printing plate precursors. Preferably, a material is used as dimensionally stable plate or foil-shaped material that has already been used as a substrate for printing matters. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability; is inexpensive and furthermore exhibits excellent adhesion to the coating. Furthermore, a composite film can be used wherein an aluminum foil has been laminated onto a polyethylene terephthalate film.

A metal substrate, in particular an aluminum substrate, is preferably subjected to at least one treatment selected from roughening (e.g. by brushing in a dry state or brushing with abrasive suspensions, or electrochemical roughening, e.g. by means of a hydrochloric acid electrolyte), anodic oxidation and application of a hydrophilizing layer.

In order to improve the hydrophilic properties of the surface of the metal substrate that has been roughened and optionally anodically oxidized in sulfuric acid or phosphoric acid, the metal substrate can be subjected to an aftertreatment with an aqueous solution of sodium silicate, calcium zirconium fluoride, polyvinylphosphonic acid or phosphoric acid. Within the framework of the present invention, the term "substrate" also encompasses an optionally pretreated substrate exhibiting, for example, a hydrophilizing layer on its surface.

The details of the above-mentioned substrate pretreatment are known to the person skilled in the art.

The additional application of a water-soluble oxygen-impermeable overcoat onto the radiation-sensitive layer can be advantageous. The polymers suitable for such an overcoat include, inter alia, polyvinyl alcohol, polyvinyl alcohol/polyvinyl acetate copolymers, polyvinyl pyrrolidone, polyvinyl pyrrolidone/polyvinyl acetate copolymers and gelatin. The layer weight of the overcoat can e.g. be 0.1 to 4 $g/m^2$, preferably 0.3 to 3 $g/m^2$. However, the printing plate precursors according to the present invention show excellent properties even without an overcoat. The overcoat can also comprise matting agents (i.e. organic or inorganic particles with a particle size of 2 to 20 μm) which facilitate the planar positioning of the film during contact exposure.

The thus produced printing plate precursors are image-wise exposed in a manner known to the person skilled in the art with radiation of an appropriate wavelength and subsequently developed with a commercially available aqueous alkaline developer. After image-wise exposure (i.e. prior to developing) a heat treatment at 50 to 180° C., preferably 90 to 150° C., can be carried out.

The developed plates can be treated with a preservative ("gumming") using a common method. The preservatives are aqueous solutions of hydrophilic polymers, wetting agents and other additives.

For certain applications, it is furthermore advantageous to increase the mechanical strength of the printing layers by subjecting them to a heat treatment (what is referred as "baking") and/or overall exposure (e.g. to UV light). For this purpose, prior to the treatment, the plate is treated with a solution that protects the non-image areas such that the heat treatment does not cause these areas to accept ink. A solution suitable for this purpose is e.g. described in U.S. Pat. No. 4,355,096. Baking usually takes place at a temperature in the range of 150 to 250° C. However, printing plates prepared from printing plate precursors according to the present invention show excellent properties even without having been subjected to a heat treatment/overall exposure. When both baking and overall exposure are carried out, the two treatment steps can be performed simultaneously or one after the other.

Lithographic printing plate precursors according to the present invention are characterized by improved photosensitivity in combination with good storage stability; the developed printing plates exhibit excellent abrasion resistance which allows a large number of copies.

Within the framework of the present invention, the term "radiation-sensitive element" also encompasses an element wherein the substrate comprises a radiation-sensitive coating (and optionally an oxygen-impermeable overcoat) on both sides. However, a one-sided coating is preferred.

The invention will be explained in more detail in the following examples.

EXAMPLES

Examples 1 and 2 and
Comparative Examples 1 to 3

An electrochemically roughened and anodized aluminum foil was subjected to a treatment with an aqueous solution of polyvinyl phosphonic acid (PVPA). The thus pretreated substrate was coated with an aqueous solution as described in Table 1 and dried for 5 minutes at 90° C.

TABLE 1

| Composition of the coating solution | |
|---|---|
| 0.82 g | Terpolymer prepared by polymerization of 476 parts by weight styrene, 476 parts by weight methylmethacrylate and 106 parts by weight methacrylic acid |
| 0.1 g | Kayamer PM-2 (1 mole phosphoric acid esterified with 1.5 mol hydroxyethyl-methacrylate from Coa Corp. Ltd., Japan) |
| 0.2 g | mercapto-3-triazole |
| 2.86 g | oligomer A |
| 0.41 g | oligomer B |
| 1.25 g | of a dispersion in propyleneglycol monomethylether comprising 7.25 wt. - % copper phthalocyanine and 7.25 wt. - % polyvinylacetal binder comprising 39.9 |

TABLE 1-continued

| Composition of the coating solution | |
|---|---|
| | mole - % vinyl alcohol, 1.2 mole - % vinyl acetate, 15.4 mole - % acetal groups derived from acetaldehyde, 36.1 mole - % acetal groups derived from butyric aldehyde and 7.4 mole - % acetal groups derived from 4-formylbenzoic acid |
| 0.115 g | bis(cyclopentadienyl)-bis-[2,6-difluoro-3-(pyrr-1-yl)-phenyl]titanium |
| 0.16 g | diphenyliodoniumchloride |
| 0.15 g | ethyl eosin |
| 45 ml | propyleneglycol monomethylether |
| 5 ml | acetone |

The solution was filtered and then applied to the pretreated substrate. The dry layer weight of the photopolymer layer was about 2 g/m$^2$.

The obtained samples were coated with an overcoat by applying an aqueous solution of poly(vinylalcohol) (Airvol 203 available from Airproducts; degree of hydrolysis: 88%). After drying for 4 minutes at 90° C., a printing plate precursor with a dry layer weight of the overcoat of about 3 g/m$^2$ was obtained.

The printing plate precursor was exposed to the light of a tungsten lamp having a metal interference filter for 532 nm for 30 seconds through a gray scale having a tonal range of 0.15 to 1.95, wherein the density increments amount to 0.15 (UGRA gray scale). Immediately after exposure, the plate was heated in an oven for 2 minutes at 90° C.

Then, the exposed plate was treated for 30 seconds with a developer solution comprising the following components:

3.4 parts by weight Rewopol NLS 28® (available from the company REWO)

1.1 parts by weight diethanol amine 1.0 parts by weight Texapon 842® (available from the company Henkel)

0.6 parts by weight Nekal BX Paste® (available from the company BASF)

0.2 parts by weight 4-toluene sulfonic acid and 93.7 parts by weight water

Then the developer solution was again rubbed over the surface for another 30 seconds using a tampon and then the entire plate was rinsed with water. After this treatment, the exposed portions remained on the plate. For the assessment of its photosensitivity, the plate was blackened in a wet state with printing ink.

For the assessment of storage stability, the unexposed printing plate precursors were stored for 60 minutes in a 90° C. oven, then exposed and developed as described above (storage stability test).

For the assessment of developability, unexposed plate precursors were heated to 90° C. for 2 minutes, rinsed with water to remove the poly(vinylalcohol) coating and then dried in an air stream. The developer was dropped onto the plate in five-second intervals. After rinsing, half of the drop marks were blackened with printing ink in a wet state (drop test).

For the preparation of a lithographic printing plate, a printing layer was applied to the aluminum foil, as explained above, exposed, heated, developed, and after rinsing with water, the developed plate was rubbed with an aqueous solution of 0.5% phosphoric acid and 6% gum arabic. The thus prepared plate was loaded in a sheet-fed offset printing machine and used for printing with an abrasive printing ink (Offset S 7184 available from Sun Chemical, containing 10% potassium carbonate).

The results are summarized in Table 2.

TABLE 2

| Example | Oligomer A | Oligomer B | Gray scales 532 nm[1] | Gray scales 532 nm[1] 60 min/90° C.[2] | Drop test | Drop test 60 min/90° C.[2] | Printing performance: number of copies |
|---|---|---|---|---|---|---|---|
| 1 | UR3447[4] | PPZ[6] | 6/10 | 6/10 | 5/5 | 5/5 | 170,000 |
| 2 | Pf3746[5] | PPZ[6] | 7/10 | 7/10 | 5/5 | 5/5 | 160,000 |
| Comp. 1 | UR3447[4] | none | 8/11 | not developable | 20/30 | >30/>30 | — |
| Comp. 2 | none | PPZ[6] | 2/6 | 3/7 | 5/5 | 5/5 | — |
| Comp. 3 | UR3447[4] | SR-355[7] | 6/10 | 5/8 | 5/5 | >30/10 | 170,000 |
| Comp. 4 | UR3447[4] | SR-368 + SR-415[8] | 5/9 | 5/8 | 5/5 | 20/10 | 130,000 |

[1] The first value indicates the solid steps of the blackened gray scale and the second value indicates the first step that did not accept printing ink.
[2] Storage stability test: Result obtained after 60 minute storage of the unexposed plate precursors at 90° C..
[3] The first value indicates the time required by the developer to clean the plate without rubbing; the second value indicates the time required for cleaning the plate after blackening.
[4] Oligomer prepared by reacting Desmodur N 100 ® (Biuret of hexamethylene diisocyanate; available from Bayer) with hydroxyethylacrylate and pentaerythritol triacrylate; amount of double bonds: 0.5 double bonds per 100 g, when all isocyanate groups have reacted with the acrylates containing hydroxyl groups.
[5] Oligomer prepared by reacting Desmodur N 100 ® with pentaerythritol triacrylate; amount of double bonds: 0.7 double bonds per 100 g, when all isocyanate groups have reacted with the acrylates containing hydroxyl groups.
[6] 2,2,4,4,6,6-Hexahydro-2,2,4,4,6,6-hexakis(2-(2-methyl-1-oxo-2-propenyl)oxy)ethoxy)-1,3,5,2,4,6-triazatriphosphorin from Idemitsu, Japan
[7] Ditrimethylolpropane tetraacrylate from Cray Valley, USA
[8] Mixture of 89 parts SR-368 (tris(2-hydroxyethyl)isocyanurate triacrylate from Cray Valley, USA) and 11 parts SR-415 (ethoxylated trimethylolpropane triacrylate from Cray Valley, USA) according to WO 00/68739

The plates according to the present invention showed high sensitivity, high resolution, and excellent storage stability and, after imaging, yielded a high number of copies on the printing machine. Comparative Examples 1 to 3 show that
1. an oligomer A of formula (I) is necessary for obtaining a degree of photosensitivity that meets practical demands, and
2. an oligomer B of formula (II) or formula (IIa) is necessary for obtaining good developability and most of all storage stability.

Example 1 and Comparative Example 3 show that phosphazene-type oligomers of formula (II) and (IIa) improve storage stability in two ways: Firstly, the photosensitivity is not descreased by ageing and secondly, the developability of the aged plates remains good.

The invention claimed is:

1. A radiation-sensitive element comprising
   (a) an optionally pretreated substrate;
   (b) a radiation-sensitive coating comprising
      (i) at least one photoinitiator or sensitizer, which is capable of absorbing radiation of a wavelength in the range of 250 to 1,200 nm;
      (ii) at least one oligomer A of formula (I)

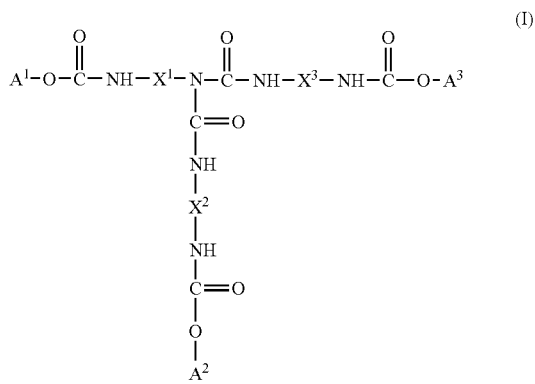

wherein $X^1$, $X^2$ and $X^3$ are independently $C_2$–$C_{18}$ alkanediyl or $C_6$–$C_{20}$ arylene,
$A^1$, $A^2$ and $A^3$ are independently
—$(CHR'$—$CHR'$—$O)_k$—$CH_2$—$CH$=$CH_2$ or a fragment represented by formula Ia

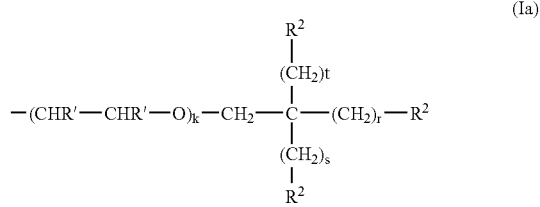

wherein k is an integer from 0 to 10, each R' is independently a hydrogen atom or $CH_3$, each $R^2$ is independently a hydrogen atom,

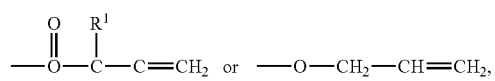

$R^1$ is a hydrogen atom or $C_1$–$C_{12}$ alkyl and
r, s and t independently are 0 or 1,
with the proviso that in each fragment $A^1$, $A^2$ and $A^3$ at least one $R^2$ is not a hydrogen atom if $A^1$, $A^2$ and $A^3$ are all a fragment represented by formula (Ia), and
(iii) at least one oligomer B, which is a phosphazene, represented by formulas (II) or (IIa):

-continued

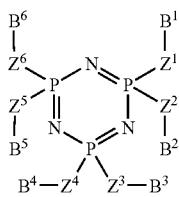
(IIa)

wherein $Z^1$, $Z^2$, $Z^3$, $Z^4$, $Z^5$ and $Z^6$ are independently —O— or —NR—, R is a hydrogen atom or $C_1$–$C_{12}$ alkyl, n is greater than 3 and $B^1$, $B^2$, $B^3$, $B^4$, $B^5$ and $B^6$ are fragments represented by formulas (III)–(VIII)

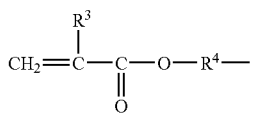
(III)

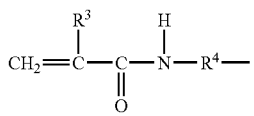
(IV)

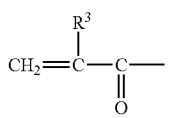
(V)

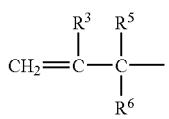
(VI)

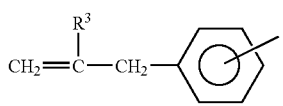
(VII)

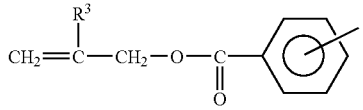
(VIII)

wherein $R^3$ is a hydrogen atom or $C_1$–$C_{12}$ alkyl, $R^4$ is $C_2$–$C_{12}$ alkanediyl and $R^5$ and $R^6$ are independently a hydrogen atom or $C_1$–$C_{12}$ alkyl; and (c) optionally, at least one additive comprising coinitiators which form free radicals after the excitation of the initiator or sensitizer with radiation of a wavelength of 250 to 1,200 nm, binders, thermopolymerization inhibitors, dyes, plasticizers, chain transfer agents, leuco dyes, inorganic fillers or surfactants.

2. The radiation-sensitive element according to claim 1, wherein $X^1$, $X^2$ and $X^3$ are the same in oligomer A.

3. The radiation-sensitive element according to claim 2, wherein $X^1$, $X^2$ and $X^3$ are hexamethylene.

4. The radiation-sensitive element according to claim 1, wherein oligomer B is a phophazene represented by formula (IIa).

5. The radiation-sensitive element according to claim 1, wherein oligomer A is the reaction product of hexamethyl-ene diisocyanate biuret and at least one acrylate of a multivalent alcohol comprising at least one hydroxyl group, and oligomer B is represented by formula (IIa) wherein each $B^1$, $B^2$, $B^3$, $B^4$, $B^5$, and $B^6$ are

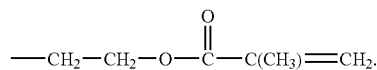

6. The radiation-sensitive element according to claim 1, wherein an oxygen-impermeable overcoat is provided on top of the radiation-sensitive coating.

7. The radiation-senstive element according to claim 1, wherein the substrate is an aluminum foil or plate that has optionally been subjected to at least one pretreatment comprising roughening, anodizing or applying a hydrophilizing layer.

8. A process for the production of an imaged element comprising
(a) providing a radiation-sensitive element
(1) an optionally pretreated substrate and
(2) a radiation-sensitive coating comprising
(i) at least one photoinitiator or sensitizer, which is capable of absorbing radiation of a wavelength in the range of 250 to 1,200 nm;
(ii) at least one oligomer A of formula (I)

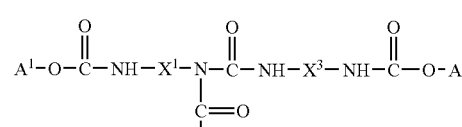
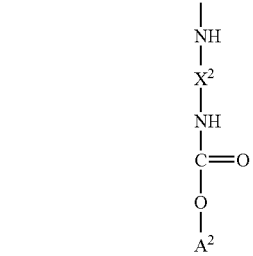
(I)

wherein $X^1$, $X^2$ and $X^3$ are independently $C_2$–$C_{18}$ alkanediyl or $C_6$–$C_{20}$ arylene,
$A^1$, $A^2$ and $A^3$ are independently
—(CHR'—CHR'—O)$_k$—CH$_2$—CH=CH$_2$ or a fragment represented by formula Ia

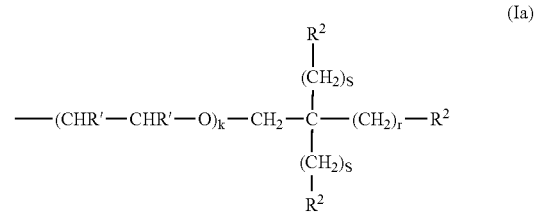
(Ia)

wherein k is an integer from 0 to 10, each R' is independently a hydrogen atom or $CH_3$, each $R^2$ is independently a hydrogen atom,

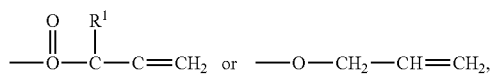

R$^1$ is a hydrogen atom or C$_1$–C$_{12}$ alkyl and r, s and t independently are 0 or 1, with the proviso that in each fragment A$^1$, A$^2$ and A$^3$ at least one R$^2$ is not a hydrogen atom if A$^1$, A$^2$ and A$^3$ are all fragments represented by formula (Ia), and (iii) at least one oligomer B, which is a phosphazene represented by formulas (II) or (IIa):

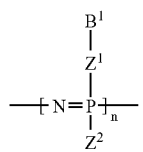
(II)

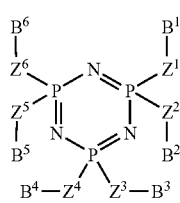
(IIa)

wherein Z$^1$, Z$^2$, Z$^3$, Z$^4$, Z$^5$ and Z$^6$ are independently —O— or —NR—, R is a hydrogen atom or C$_1$–C$_{12}$ alkyl, n is greater than 3 and B$^1$, B$^2$, B$^3$, B$^4$, B$^5$ and B$^6$ are fragments represented by formulas (III)–(VIII)

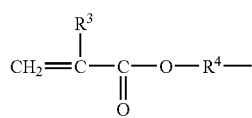
(III)

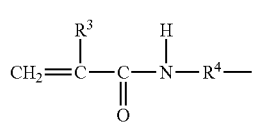
(IV)

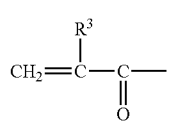
(V)

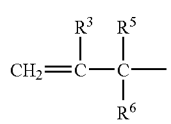
(VI)

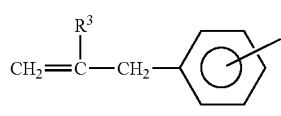
(VII)

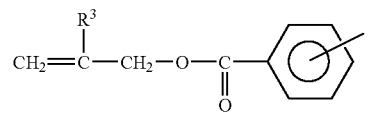
(VIII)

wherein R$^3$ is a hydrogen atom or C$_1$–C$_{12}$ alkyl, R$^4$ is C$_2$–C$_{12}$ alkanediyl and R$^5$ and R$^6$ are independently a hydrogen atom or C$_1$–C$_{12}$ alkyl;

(b) image-wise irradiation of the radiation-sensitive element with radiation of a wavelength adjusted to the absorber contained in the radiation-sensitive coating of the element;

(c) optionally heating the image-wise irradiated element;

(d) removing the non-irradiated areas with an aqueous alkaline developer to provide the imaged element; and (e) optionally heating the imaged element obtained in step (d) or subjecting it to overall exposure or both.

9. A radiation-sensitive composition comprising (i) at least one photoinitiator or sensitizer, which is capable of absorbing radiation of a wavelength in the range of 250 to 1,200 nm;

(ii) at least one oligomer A of formula (I)

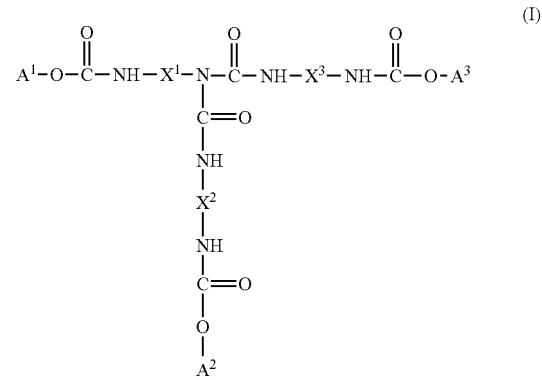
(I)

wherein X$^1$, X$^2$ and X$^3$ are independently C$_2$–C$_{18}$ alkanediyl or C$_6$–C$_{20}$ arylene, A$^1$, A$^2$ and A$^3$ are independently —(CHR'—CHR'—O)$_k$—CH$_2$—CH=CH$_2$ or a fragment represented by formula Ia

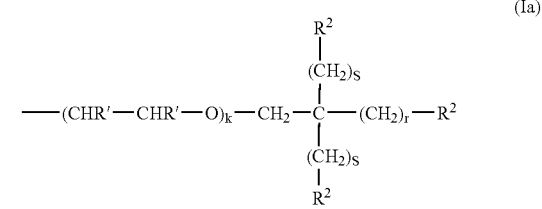
(Ia)

wherein k is an integer from 0 to 10, each R' is independently a hydrogen atom or CH$_3$, each R$^2$ is independently a hydrogen atom,

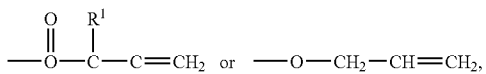

$R^1$ is a hydrogen atom or $C_1–C_{12}$ alkyl and r, s and t independently are 0 or 1, with the proviso that in each fragment $A^1$, $A^2$ and $A^3$ at least one $R^2$ is not a hydrogen atom if $A^1$, $A^2$ and $A^3$ are all fragments represented by formula (Ia), and (iii) at least one oligomer B, which is a phosphazene represented by formulas (II) or (IIa):

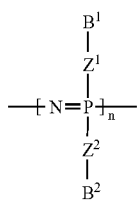
(II)

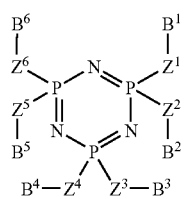
(IIa)

wherein $Z^1$, $Z^2$, $Z^3$, $Z^4$, $Z^5$ and $Z^6$ are independently —O— or —NR—, R is a hydrogen atom or $C_1–C_{12}$ alkyl, n is greater than 3 and $B^1$, $B^2$, $B^3$, $B^4$, $B^5$ and $B^6$ are fragments represented by formulas (III)–(VIII)

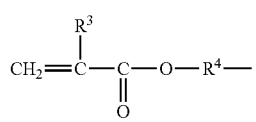
(III)

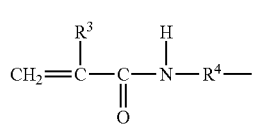
(IV)

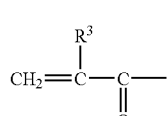
(V)

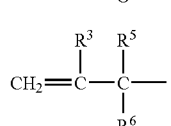
(VI)

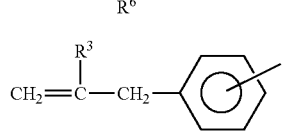
(VII)

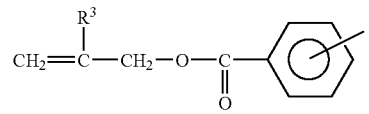
(VIII)

wherein $R^3$ is a hydrogen atom or $C_1–C_{12}$ alkyl, $R^4$ is $C_1–C_{12}$ alkanediyl and $R^5$ and $R^6$ are independently a hydrogen atom or $C_1–C_{12}$ alkyl; and (iv) a solvent or solvent mixture; and (v) optionally at least one additive comprising coinitiators which form free radicals after the excitation of the photoinitiator or sensitizer with radiation of a wavelength of 250 to 1,200 nm, binders, thermopolymerization inhibitors, dyes, plasticizers, chain transfer agents, leuco dyes, inorganic fillers or surfactants.

10. A process for the production of a radiation-sensitive element comprising the steps of:

(a) providing an optionally pretreated substrate;

(b) applying a radiation-sensitive composition comprising:

(1) at least one photoinitiator and sensitizer, which is capable of absorbing radiation of a wavelength in the range of 250 to 1,200 nm;

(2) at least one oligomer A of formula (I)

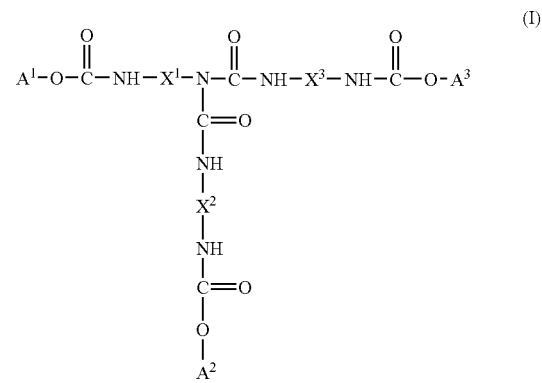
(I)

wherein $X^1$, $X^2$ and $X^3$ are independently $C_2–C_{18}$ alkanediyl or $C_6–C_{20}$ arylene, $A^1$, $A^2$ and $A^3$ are independently —(CHR'—CHR'—O)$_k$—CH$_2$—CH=CH$_2$ or a fragment represented by formula Ia

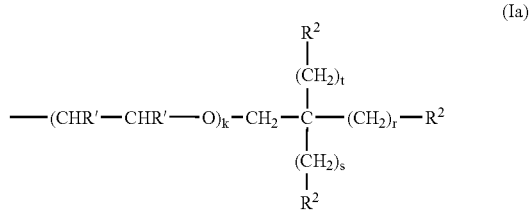
(Ia)

wherein k is an integer from 0 to 10, each R' is independently a hydrogen atom or $CH_3$, each $R^2$ is independently a hydrogen atom,

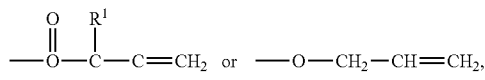 or 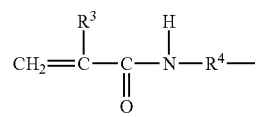, $R^1$ is a hydrogen atom or $C_1$–$C_{12}$ alkyl and r, s and t independently are 0 or 1, with the proviso that in each fragment $A^1$, $A^2$ and $A^3$ at least one $R^2$ is not a hydrogen atom if $A^1$, $A^2$ and $A^3$ are all fragments represented by formula (Ia), and (3) at least one oligomer B, which is a phosphazene represented by formulas (II) or (IIa):

(II)

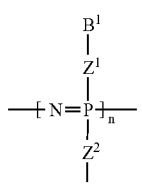

(IIa)

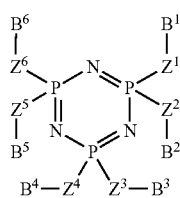

wherein $Z^1$, $Z^2$, $Z^3$, $Z^4$, $Z^5$ and $Z^6$ are independently —O— or —NR—, R is a hydrogen atom or $C_1$–$C_{12}$ alkyl, n is greater than 3 and $B^1$, $B^2$, $B^3$, $B^4$, $B^5$ and $B^6$ are represented by formulas (III)–(VIII)

(III)

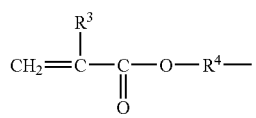

-continued (IV)

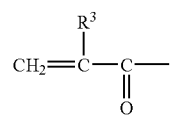

(V)

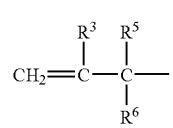

(VI)

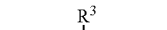

(VII)

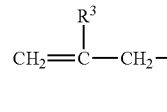

(VIII)

wherein $R^3$ is a hydrogen atom or $C_1$–$C_{12}$ alkyl, $R^4$ is $C_1$–$C_{12}$ alkanediyl and $R^5$ and $R^6$ are independently a hydrogen atom or $C_1$–$C_{12}$ alkyl; and (4) a solvent or solvent mixture;

(c) drying; and (d) optionally applying an oxygen-impermeable overcoat and drying.

* * * * *

UNITED STATES PATENT AND TRADEMARK OFFICE
CERTIFICATE OF CORRECTION

PATENT NO. : 7,169,534 B2
APPLICATION NO. : 10/536510
DATED : January 30, 2007
INVENTOR(S) : Frankie F. Roohparvar It is certified that error appears in the above-identified patent and that said Letters Patent is hereby corrected as shown below:

On column 16 lines 45-48, delete:

and insert therefor:

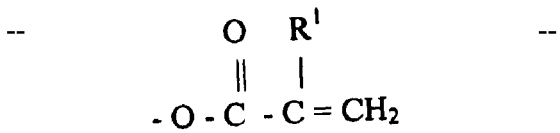

On column 18 lines 55-64, delete

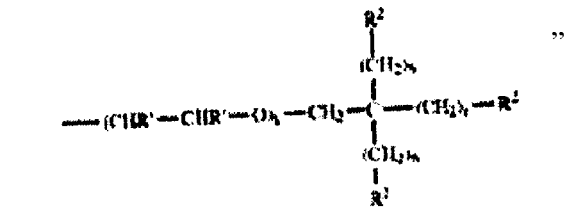

UNITED STATES PATENT AND TRADEMARK OFFICE
CERTIFICATE OF CORRECTION

PATENT NO. : 7,169,534 B2  Page 2 of 2
APPLICATION NO. : 10/536510
DATED : January 30, 2007
INVENTOR(S) : Frankie F. Roohparvar It is certified that error appears in the above-identified patent and that said Letters Patent is hereby corrected as shown below:

and insert therefor:

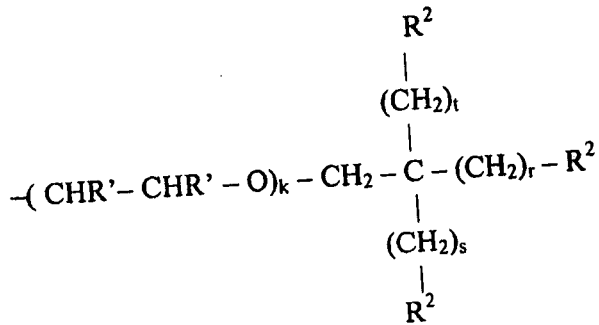

Signed and Sealed this

Tenth Day of June, 2008

JON W. DUDAS
*Director of the United States Patent and Trademark Office*